United States Patent
Dunipace

(10) Patent No.: US 7,890,832 B2
(45) Date of Patent: *Feb. 15, 2011

(54) METHOD FOR ACCURACY IMPROVEMENT ALLOWING CHIP-BY-CHIP MEASUREMENT CORRECTION

(75) Inventor: Richard A. Dunipace, Highland Village, TX (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/834,558

(22) Filed: Jul. 12, 2010

(65) Prior Publication Data

US 2010/0281320 A1    Nov. 4, 2010

Related U.S. Application Data

(62) Division of application No. 11/399,547, filed on Apr. 6, 2006, now Pat. No. 7,757,147.

(51) Int. Cl.
*H03M 13/00* (2006.01)
*G06F 11/30* (2006.01)
*G08C 25/00* (2006.01)

(52) U.S. Cl. .................. 714/746; 714/800; 714/755; 714/786; 341/118; 341/143; 341/144

(58) Field of Classification Search ............... 714/746; 341/118, 143, 144
See application file for complete search history.

(56) References Cited

U.S. PATENT DOCUMENTS

| 6,016,112 | A | 1/2000 | Knudsen |
| 7,757,147 | B2 * | 7/2010 | Dunipace .................. 714/746 |

* cited by examiner

*Primary Examiner*—Guy J Lamarre
(74) *Attorney, Agent, or Firm*—Howison & Arnott, LLP

(57) ABSTRACT

A method for allowing measurement corrections on a chip-by-chip basis. Error correction values are generated responsive to the input value to a circuit of the calibrated integrated circuit chip and to a measured value from the circuit of the calibrated integrated circuit chip. The error correction values are stored within an error correction table within a nonvolatile memory of the integrated circuit chip.

8 Claims, 5 Drawing Sheets

# METHOD FOR ACCURACY IMPROVEMENT ALLOWING CHIP-BY-CHIP MEASUREMENT CORRECTION

CROSS-REFERENCE TO RELATED APPLICATIONS

This application is a Divisional of U.S. Pat. No. 7,757,147, titled METHOD FOR ACCURACY IMPROVEMENT ALLOWING CHIP-BY-CHIP MEASUREMENT CORRECTION, issued Jul. 13, 2010, which is incorporated herein by reference.

TECHNICAL FIELD

The present invention relates to signal measurements within integrated circuit devices, and more particularly, to a method for providing chip-by-chip measurement corrections for signal measurements within integrated circuit devices.

BACKGROUND

Many integrated circuits require calibration or trim applications to be performed in order to meet published specification with respect to the integrated circuit. However, practical limitations, such as circuit design or architecture, may limit the accuracy of a finished part causing variations in the various outputs provided by a circuit on a circuit-by-circuit basis. This type of variation between various integrated circuit devices may negatively influence market acceptance wherein users are expecting each device to function according to the published specifications. Thus, there is a need for some method for enabling individual integrated circuit devices on a chip-by-chip basis to be configured to operate according to the published specification such that any particular part may be accurate within a desirable degree of acceptance.

SUMMARY

The present invention disclosed and claimed herein, in one aspect thereof, comprises a method for making measurement corrections on a chip-by-chip basis. The method initially involves generating error correction values which are the difference between the desired output of the part under test and the actual output achieved. The generated error correction values are stored within an error correction table in a nonvolatile memory of the integrated circuit chip. The error correction values can be used by the host processor in an application of the integrated circuit to correct measurement inaccuracy of the integrated circuit.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION

Figure 1:
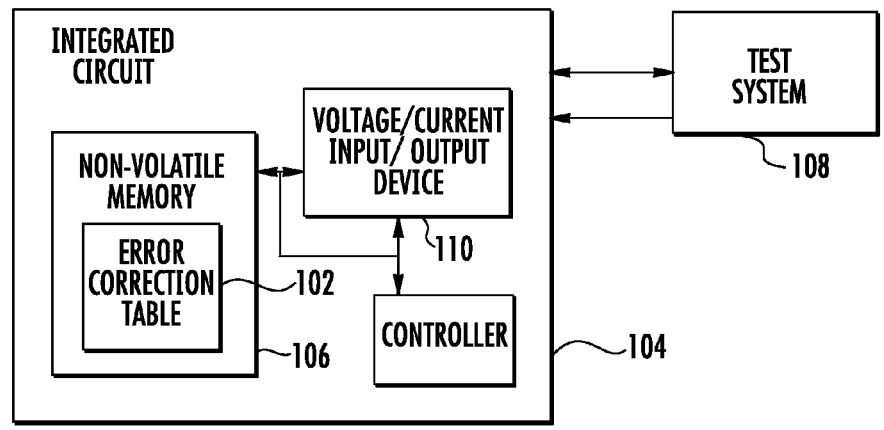
FIG. 1 is a block diagram illustrating an integrated circuit including an error correction table.

Referring now to the drawings, wherein like reference numbers are used herein to designate like elements throughout the various views, embodiments of the present invention are illustrated and described, and other possible embodiments of the present invention are described. The figures are not necessarily drawn to scale, and in some instances the drawings have been exaggerated and/or simplified in places for illustrative purposes only. One of ordinary skill in the art will appreciate the many possible applications and variations of the present invention based on the following examples of possible embodiments of the present invention.

Referring now to FIG. 1, there is illustrated a method for extending the accuracy of a particular integrated circuit device by storing measurement errors in an error correction table 102 within the integrated circuit 104. The error correction table 102 is stored within an on-board memory, typically non-volatile, 106 within the integrated circuit 104. The error correction table 102 values are created by the test system 108 employed to both test and calibrate, if required, the integrated circuit 104 during the test process. The test system 108 interfaces with the integrated circuit and reads back the measured digital values from the circuit and provides test voltage/current inputs to the circuit. The error correction table 102 may have values stored therein to correct a number of measurement values with respect to various voltage/current input/output devices 110 to the integrated circuit 104. The voltage/current inputs 110 include some type of output interface enabling the measurement. In this manner, measurements of various devices 110 may be corrected to within a desired accuracy based upon the published specification of the integrated circuit 104 using the stored values within the table 102 in order to have the integrated circuit device 104 operate in a desired manner. Once the integrated circuit has been installed in the downstream application, the error correction values can be used by the host processor of the application of the integrated circuit 104 to correct measurement inaccuracy.

Figure 2:
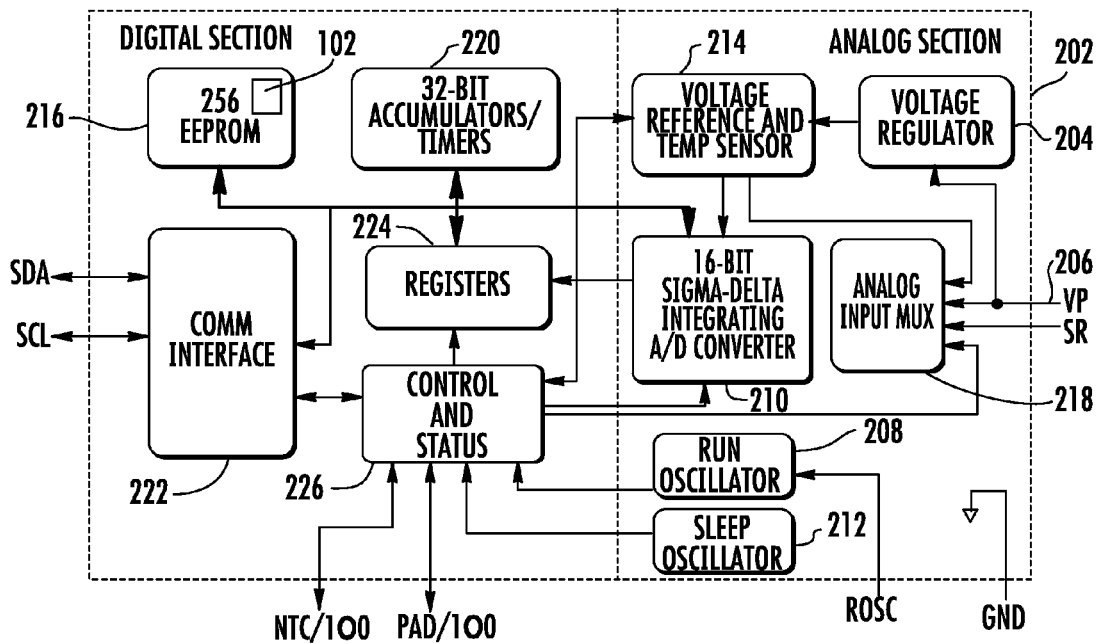
FIG. 2 is a block diagram of one embodiment of an integrated circuit device including the error correction table.

Referring now to FIG. 2, there is illustrated an example of one implementation of the error correction table 102 within a particular integrated circuit 202. The particular circuit 202 illustrated in FIG. 2 comprises a highly accurate integrated circuit that measures, stores and reports on all the critical parameters required for rechargeable battery monitoring with a minimum of external components. An internal voltage regulator 204 supports 1-cell series lithium pack configurations. The internal regulator draws power directly from the VP input 206.

An integrated precision time base is provided from highly accurate RC run oscillator 208 that provides precise timing for the sigma delta A/D converter 210 without the need for an external crystal. The time base is trimmed during manufacture to a normal frequency of 131.072 kH. A sleep oscillator 212 provides a timing signal during sleep mode. A voltage reference and temperature sensor package 214 includes an integrated temperature sensor that can eliminate the need for an external thermistor and additionally provides a reference voltage to the analog section of the integrated circuit 202. An EEPROM 216 acts as a nonvolatile memory for the integrated circuit 202. The memory 216 stores nonvolatile parameters such as cell models for use with system firmware and the correction table 102 described previously. The A/D converter 210 comprises an integrating sigma delta converter together with an analog input multiplexer 218 that has inputs for charge and discharge currents, pack voltage, GPAD voltage, the on-chip temperature sensor and an off-chip thermistor. The converter 210 can be programmed to perform a conversion with a magnitude resolution of 8-15 bits while using various reference voltages.

Accumulator/timers 220 include four 32-bit accumulators and four 32-bit elapsed time counters. A discharged current accumulator and a current charge accumulator record discharge and charge capacity values. A discharge time counter and a charge time counter maintain the total discharge times and charge times, respectively. Accumulated charge and discharge values can be used to determine the state of charge of a battery as well as cycle count information. With the information provided by the elapsed time counters, average charge and discharge currents over an extended period of time may be calculated. The chip additionally includes a communications interface 222 for providing external digital communication with the integrated circuit 202. Registers 224 provide for storage of various information. Control and status 226 provide for control of operations of the integrated circuit device in both the digital section and analog section responsive to timing signals and externally provided control signals.

While the above provided example of the error correction table 102 within the nonvolatile memory of a particular integrated circuit device is described with respect to FIG. 2, it should be realized that the error correction table 102 may be incorporated into the nonvolatile memory of any integrated circuit device wherein it is desired to correct the output values of various circuits within the integrated circuit device to a particularly desired range of values.

The following descriptions are provided with respect to correcting the output values of the analog-to-digital converter 210 described with respect to FIG. 2. However, it would be appreciated by one skilled in the art that any number of output values, either voltage values or current values of any circuit with an input and output interface, such as a sensor, may be corrected in a similar fashion.

Figure 3:
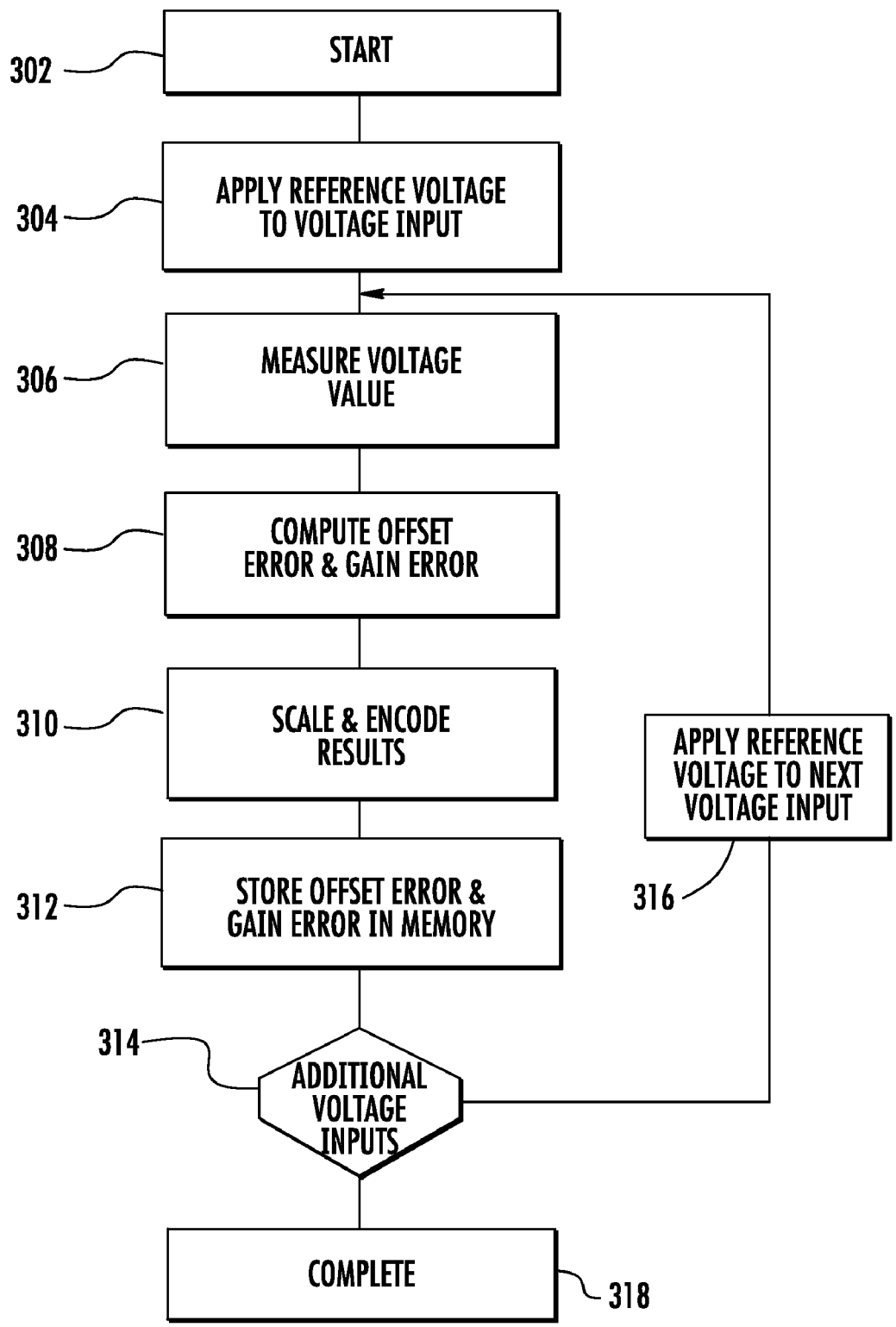
FIG. 3 is a flow diagram illustrating the operation of the method for generating the entries within the error correction table.

Referring now to FIG. 3, there is illustrated a flow diagram illustrating the process for generating the correction values to be stored within the error correction table 102 with respect to the analog-to-digital converter 210 of FIG. 2. Once the process has started at step 302, the accuracy of the output provided by the A/D converter must be determined. This is accomplished by applying a reference voltage to an input of the A/D converter at step 304. The input voltage is converted to a digital number at step 306, and the measurement is compared to the input signal at step 308 in order to compute the offset error and gain error for that particular input of the A/D converter. Once the offset error and gain error have been computed, they may be scaled and encoded at step 310 before storage within the nonvolatile memory at step 312. Scaling and encoding of the offset error and gain error are done to make it easy for an end user to use the resultant error terms to correct a measurement at point of use, and to assist in fitting the provided data into an available memory space within the nonvolatile memory. Inquiry step 314 determines if there are additional inputs on the A/D converter and, if so, control passes to step 316 wherein the reference voltage is applied to a next input and control returns to step 306. Once all of the A/D inputs have been converted to a digital number, the process is completed at step 318.

Figure 4:
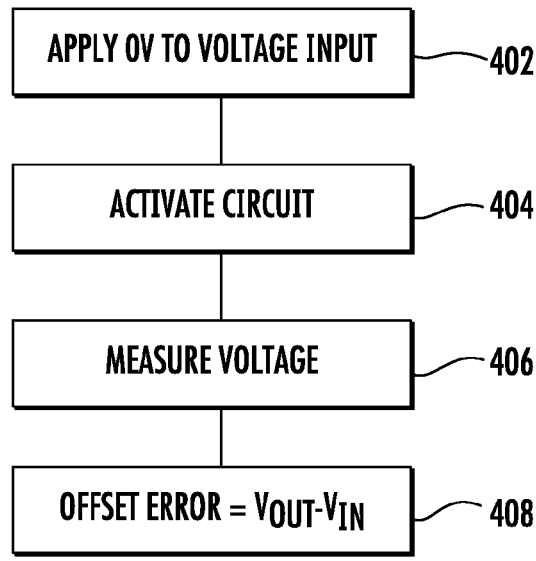
FIG. 4 is a flow diagram describing the process for generating the offset error.

FIG. 4 illustrates the process used to compute the offset error value for storage within the table 102 for the A/D converter of FIG. 2. Initially, a reference voltage of 0 V is applied to the input of the A/D connector being tested at step 402 and the A/D converter to be tested is activated at step 404. The voltage measurement is performed at step 406, and the offset error is calculated at step 408 by determining the difference between the analog equivalent of the A/D digital output and the 0 V input reference voltage. As described previously, rather than generating offset errors for various voltage signals, offset errors for current signals could also be generated.

Figure 5:
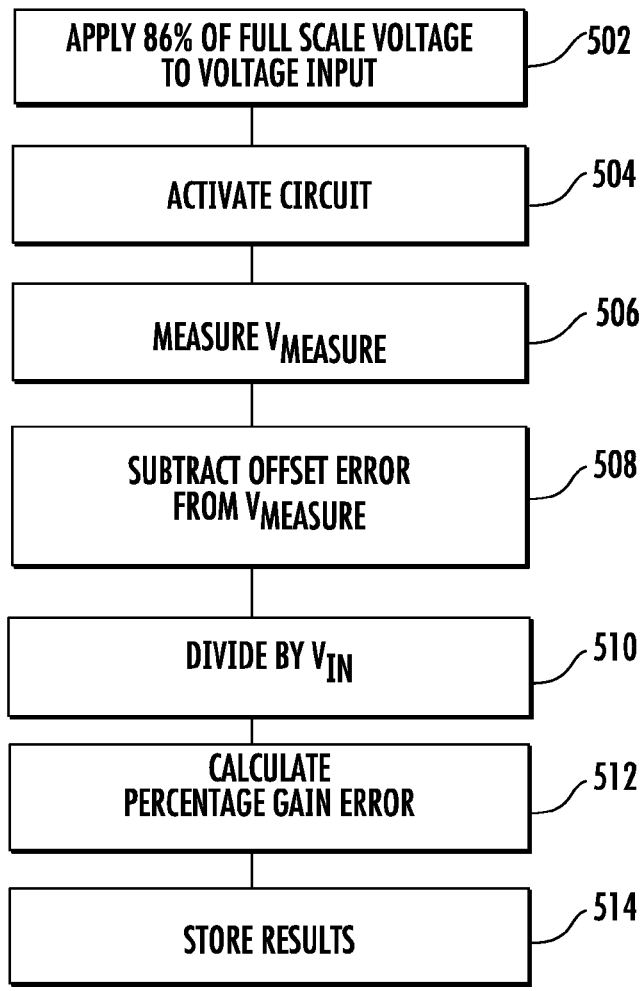
FIG. 5 is a flow diagram illustrating the process for generating the gain error.

Referring now to FIG. 5, there is illustrated the process for determining the gain error with respect to the A/D converter. Initially, at step 502, a signal that is 86% of full scale voltage is applied to the input of the A/D converter. The value of 86% was used so that the A/D output would not be over ranged and thus the A/D converter operates incorrectly. Other values than 86% may be used. The selected value should be something less than full scale that incorporates a worst case situation but allows the A/D converter to operate properly. The associated circuit, in this case, the A/D converter, is activated at step 504 and the input signal is measured at step 506. The measurement provides a digital measurement of the input signal which is then output, but the present method is applicable to any digital measurement whether it is output or not. The offset error voltage is subtracted from the measured signal at step 508, and the resulting value is divided by the applied input voltage at step 510. This result provides the percentage gain error value at step 512. The use of a percentage error automatically scales the data into a readily usable format irrespective of the level of the original measurement. The results are then stored at step 514.

Figure 6:
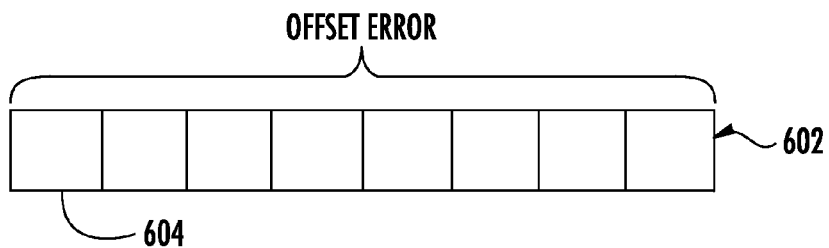
FIG. 6 is an illustration of the memory storage area for the offset error within a nonvolatile memory.
Figure 7:
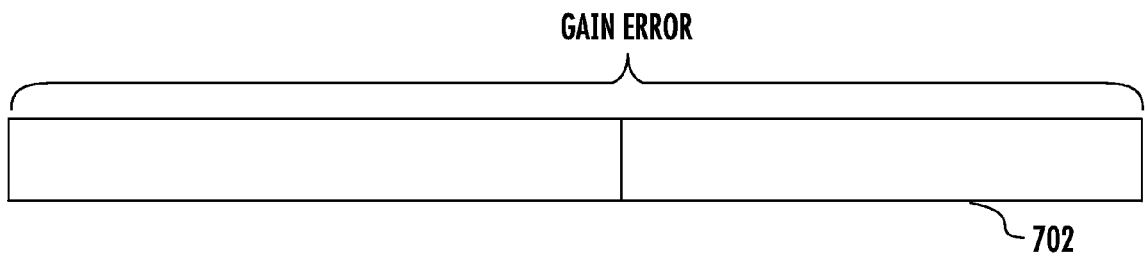
FIG. 7 illustrates the memory storage area for the gain error within a nonvolatile memory.

As mentioned previously, scaling and encoding of the gain error and offset error assists in fitting the data into an available memory space of the nonvolatile memory. Referring now to FIGS. 6 and 7, there are illustrated storage locations for associated offset errors and gain errors within the nonvolatile memory. FIG. 6 illustrates a storage location for the offset error. The offset error is stored within a single 8-bit word 602. The most significant bit 604 is used to indicate the offset polarity of the offset error. A "1" indicates a positive offset and a "0" indicates a negative offset. Referring now to FIG. 7, there is illustrated the storage area for the gain error. The gain error is stored in a single 16-bit word 702.

Figure 8:
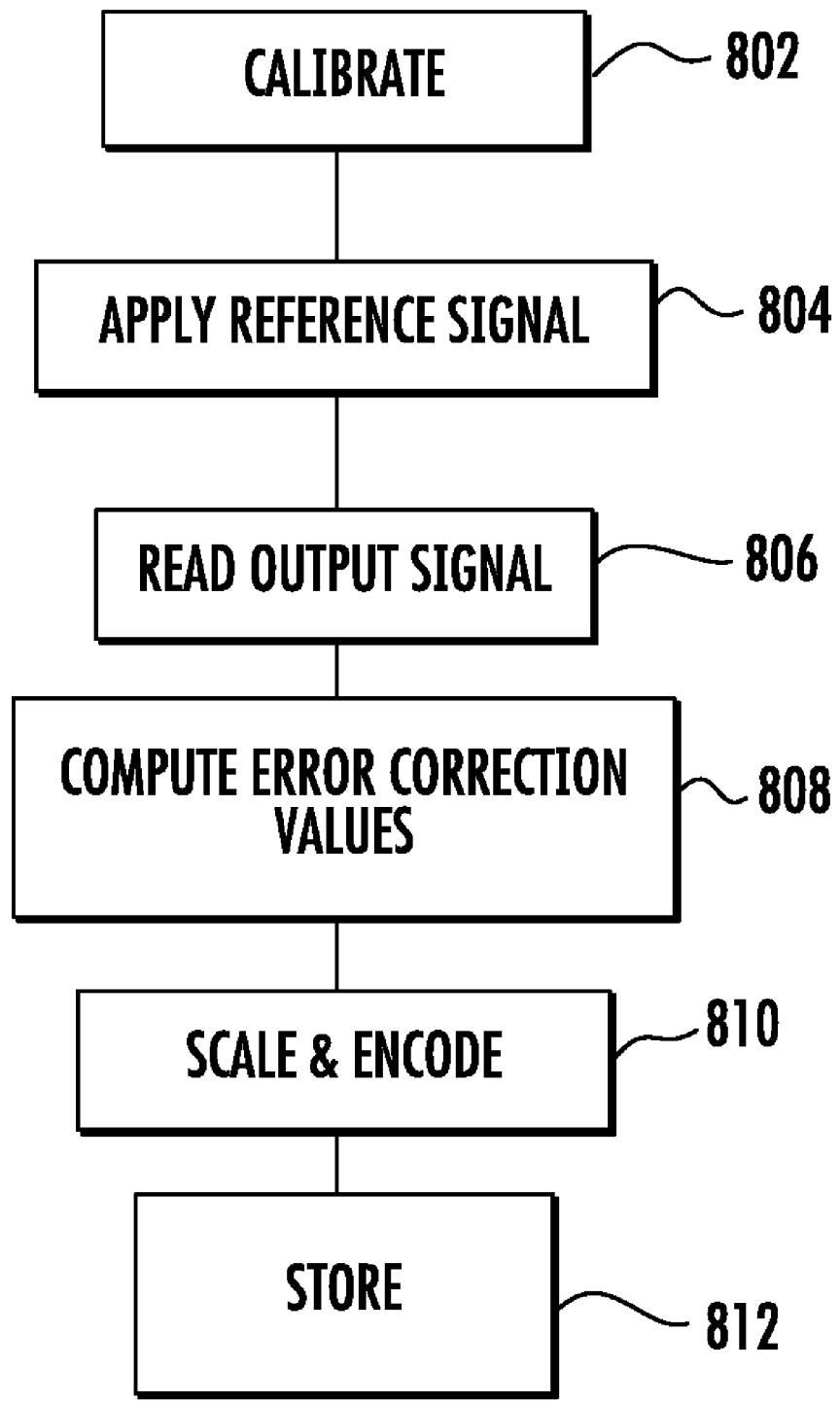
FIG. 8 is a flow diagram illustrating a more generalized method for generating error correction entries for the error correction table.

Referring now to FIG. 8, there is illustrated a flow diagram illustrating the process for generating the correction values to be stored within the error correction table 102 with respect to any integrated circuit device. Initially, the integrated circuit 104 is fully calibrated or trimmed using the test and calibration software of associated calibration device 108 at step 802. Once the calibration has been completed at step 802, the accuracy of the output provided by a circuit within the integrated circuit 104 must be determined. This is accomplished by applying a reference signal to an input of the circuit at step 804. The output signal from the circuit is read at step 806, and the output signal is used with the input signal at step 808 in order to compute the error correction values for the particular circuit. Once the correction values have been computed, they may be scaled and encoded at step 810 before storage within the nonvolatile memory at step 812.

Figure 9:
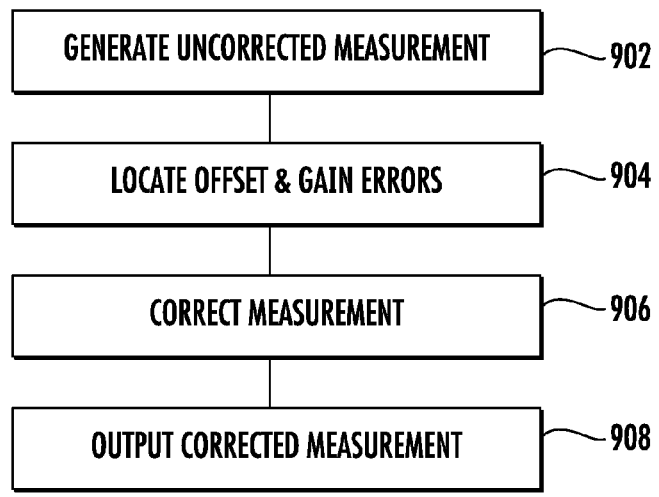
FIG. 9 is a flow diagram illustrating the use of error correction values from the error correction table in an integrated circuit.

Once the error values have been stored for each of the appropriate signals, an associated output signal may be error corrected as illustrated in FIG. 9. The uncorrected signal or measurement is initially generated at step 902. The error values associated with the uncorrected signal are located at step 904 within the correction table stored in nonvolatile memory. The output signal or measurement is corrected at step 906 using the located error values such that the corrected output signal or measurement may be generated at step 908.

Storing the measurement error correction values within the particular integrated circuit device allows the end user to correct measurements after a point of manufacture. The correction methodology may be incorporated within specialized software (i.e., the battery bench) used to demonstrate the part to a customer. The correction is also used in applications where it is important to meet particular published specifications. Thus, using the above-described method, an individual chip software fix for hardware inaccuracy issues may be implemented after hardware design is completed. The method can be substituted for actively trimming the part in some cases. Improved accuracy of measurements will help to improve market usefulness and acceptance. Using the described method, a simpler part design may be used in a more demanding application, thus lowering a selling price of a product and increasing its sales margin.

It will be appreciated by those skilled in the art having the benefit of this disclosure that this invention provides an improved method for correcting an output signal within a particular integrated circuit device. It should be understood that the drawings and detailed description herein are to be regarded in an illustrative rather than a restrictive manner, and are not intended to limit the invention to the particular forms and examples disclosed. On the contrary, the invention includes any further modifications, changes, rearrangements, substitutions, alternatives, design choices, and embodiments apparent to those of ordinary skill in the art, without departing from the spirit and scope of this invention, as defined by the following claims. Thus, it is intended that the following claims be interpreted to embrace all such further modifications, changes, rearrangements, substitutions, alternatives, design choices, and embodiments.

What is claimed is:

1. A method for allowing measurement corrections on a chip by chip basis, comprising the steps of:
    applying a reference value to an input of a circuit of an integrated circuit chip;
    measuring an output value generated by the circuit of the integrated circuit chip responsive to the reference value;
    generating an offset error for the circuit by determining a difference between an analog equivalent of the output value and the reference value;
    applying an input value comprising a reduced percentage of full scale to the input of the integrated circuit chip;
    measuring a second output value responsive to the input value at the output of the integrated circuit chip;
    generating a gain error value for the output of the integrated circuit chip by subtracting the offset error from the second output value and dividing by the input value for the output of the integrated circuit chip;
    storing the offset error and the gain error in an error correction table within a non-volatile memory of the integrated circuit chip.

2. The method of claim 1, further including the step of applying the offset error and the gain error to measured values of the circuit of the integrated circuit during operation of the circuit.

3. The method of claim 1, further including the step of scaling and encoding the generated offset error and the gain error prior to storage in the error correction table.

4. The method of claim 1, wherein the step of generating further includes the step of generating the offset error for a plurality of measured outputs of the circuit of the integrated circuit chip.

5. An integrated circuit chip, comprising:
    circuitry including an input for receiving a first input value for generating a first measurement value responsive to the first input value and for receiving a second input value for generating a second measurement value responsive to the second input value;
    a non-volatile memory; and
    an error correction table within the non-volatile memory for storing error correction values, the error correction values correcting at least one output of the second circuitry, wherein the error correction values further comprise an offset error generated by determining a difference between an analog equivalent of the first measurement value at an output of the second circuitry and the first input value applied to the input of the second circuitry and a gain error generated by subtracting the offset error at an output of the second circuitry from the second measurement value at the output of the second circuitry divided by the second input value at the input of the second circuitry.

6. The integrated circuit chip of claim 5, further including control circuitry for applying the error correction values to the measurement values of the electronic circuit.

7. The integrated circuit chip of claim 5, further including control circuitry for scaling and encoding the generated error correction values prior to storage in the error correction table.

8. The integrated circuit chip of claim 5, wherein the second circuitry further includes a plurality of inputs for receiving a plurality of first input values and second input values and generates a plurality of first measurement signals responsive to the plurality of first input values and a plurality of second measurement signals responsive to the plurality of second input values.

* * * * *

UNITED STATES PATENT AND TRADEMARK OFFICE
CERTIFICATE OF CORRECTION

| | | |
|---|---|---|
| PATENT NO. | : 7,890,832 B2 | Page 1 of 1 |
| APPLICATION NO. | : 12/834558 | |
| DATED | : February 15, 2011 | |
| INVENTOR(S) | : Dunipace | |

It is certified that error appears in the above-identified patent and that said Letters Patent is hereby corrected as shown below:

At Claim 5, Column 6, Lines 28-29, replace "second circuitry" with --circuitry--.
At Claim 5, Column 6, Line 32, replace "second circuitry" with --circuitry--.
At Claim 5, Column 6, Lines 33-34, replace "second circuitry" with --circuitry--.
At Claim 5, Column 6, Line 35, replace "second circuitry" with --circuitry--.
At Claim 5, Column 6, Lines 36-37, replace "second circuitry" with --circuitry--.
At Claim 5, Column 6, Line 38, replace "second circuitry" with --circuitry--.
At Claim 8, Column 6, Lines 45-46, replace "second circuitry" with --circuitry--.

Signed and Sealed this
Twenty-sixth Day of February, 2013

Teresa Stanek Rea
*Acting Director of the United States Patent and Trademark Office*